US010296015B2

(12) United States Patent
Odai et al.

(10) Patent No.: US 10,296,015 B2
(45) Date of Patent: May 21, 2019

(54) FREQUENCY-CHARACTERISTICS MEASUREMENT METHOD AND POSITIONING CONTROL DEVICE

(71) Applicant: Hitachi, Ltd., Chiyoda-ku, Tokyo (JP)

(72) Inventors: Masaki Odai, Tokyo (JP); Yasuyuki Momoi, Tokyo (JP); Hironori Ogawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 334 days.

(21) Appl. No.: 15/025,945

(22) PCT Filed: Nov. 15, 2013

(86) PCT No.: PCT/JP2013/080896
§ 371 (c)(1),
(2) Date: Mar. 30, 2016

(87) PCT Pub. No.: WO2015/072011
PCT Pub. Date: May 21, 2015

(65) Prior Publication Data
US 2016/0246305 A1    Aug. 25, 2016

(51) Int. Cl.
*G05D 3/12* (2006.01)
*G05B 19/00* (2006.01)
(Continued)

(52) U.S. Cl.
CPC ............... *G05D 3/12* (2013.01); *G01R 23/20* (2013.01); *G05B 15/02* (2013.01); *G05B 19/00* (2013.01)

(58) Field of Classification Search
CPC .......... G05D 3/12; G05B 15/02; G05B 19/00; G01R 23/20
See application file for complete search history.

(56) References Cited

U.S. PATENT DOCUMENTS 5,251,155 A    10/1993  Adachi
5,870,242 A     2/1999  Abe et al.
(Continued)

FOREIGN PATENT DOCUMENTS

JP    3-217901 A    9/1991
JP    9-180355 A    7/1997
(Continued)

OTHER PUBLICATIONS

International Search Report (PCT/ISA/210) issued in PCT Application No. PCT/JP2013/080896 dated Dec. 17, 2013 with English translation (5 pages).
(Continued)

*Primary Examiner* — Cuong B Nguyen
(74) *Attorney, Agent, or Firm* — Crowell & Moring LLP

(57) ABSTRACT

A sinusoidal signal that is frequency-swept so as to have a frequency region in which each frequency has a different number of cycles and/or application duration is applied to a control system in a movement device that moves a movement target, time-series data for transmission characteristics obtained from said control system as a result of the application of the aforementioned sinusoidal signal is acquired, and said time-series data is subjected to spectral analysis. This allows the provision of a positioning control device and a frequency-characteristics measurement method that make it possible to optimize measuring precision while minimizing increases in the amount of time it takes to measure frequency characteristics.

18 Claims, 9 Drawing Sheets

(51) Int. Cl.
*G01R 23/20* (2006.01)
*G05B 15/02* (2006.01)

(56) References Cited

U.S. PATENT DOCUMENTS

| | | | | |
|---|---|---|---|---|
| 6,720,680 | B1* | 4/2004 | Tanaka | G03F 7/70725 |
| | | | | 310/12.19 |
| 2007/0052326 | A1* | 3/2007 | Liu | B23B 29/125 |
| | | | | 310/323.18 |
| 2008/0018284 | A1* | 1/2008 | Kinpara | H02P 21/14 |
| | | | | 318/490 |
| 2014/0203821 | A1* | 7/2014 | Yamamoto | H01J 37/32917 |
| | | | | 324/654 |
| 2016/0123796 | A1* | 5/2016 | Nagaoka | G05B 19/4062 |
| | | | | 702/56 |

FOREIGN PATENT DOCUMENTS

| | | |
|---|---|---|
| JP | 10-339751 A | 12/1998 |
| JP | 2006-195543 A | 7/2006 |
| JP | 2006-333594 A | 12/2006 |
| JP | 2009-247088 A | 10/2009 |

OTHER PUBLICATIONS

International Preliminary Report on Patentability (PCT/IB/338 & PCT/IB/373) issued in PCT Application No. PCT/JP2013/080896 dated May 26, 2016, including English translation of Japanese-language Written Opinion (PCT/ISA/237), (7 pages).

* cited by examiner

THEORETICAL FREQUENCY CHARACTERISTICS OF DISCRETE SINE-WAVE

MEASURED FREQUENCY CHARACTERISTICS OF DISCRETE SINE-WAVE

MEASURED FREQUENCY CHARACTERISTICS OF DISCRETE SINE-WAVE

FREQUENCY-CHARACTERISTICS MEASUREMENT METHOD AND POSITIONING CONTROL DEVICE

TECHNICAL FIELD

The present invention relates to a frequency-characteristics measurement method and a positioning control device that are used for controlling a position of a mobile body.

BACKGROUND ART

In industrial machinery, such as various processing devices and mechatronics manufacturing/inspection devices, examples of primary factors for determining quality of manufactured products and mechatronics products, include accuracy of positioning a mobile body included in a device. For example, in semiconductor manufacturing inspection devices or devices for mounting a component on a substrate, accuracy of positioning control of a mobile body influences the quality of products. For example, in elevators, the accuracy is an important factor for determining safety and comfortable rides. Technology development for improving the accuracy of the positioning, has been pursued.

Frequency characteristics of a mechanism system and a control system are used for designing and adjusting the above positioning control system. Measurement accuracy of the frequency characteristics influences accuracy of the positioning. For example, as a technique relating to measurement of the above frequency characteristics, PTL 1 (JP 10-339751 A) discloses an analog/digital coexisting simulating method. A signal level of an input signal, sweep start frequency, finish frequency, and an amount of a frequency step between the sweep start frequency and the finish frequency, are set. Then, a transient-characteristics analysis including an analog form and a digital form coexisting is performed from the sweep start frequency point. After that, a result of the output signal is subjected to a Fourier analysis. Signal intensity of each of a real part and an imaginary part at the input signal frequency point, is acquired so that a signal level and a phase are acquired. Until the sweep finish frequency, the analysis including the analog form and the digital form coexisting, and the Fourier analysis are repeatedly performed so that the output signal and frequency characteristics of the phase are acquired.

CITATION LIST

Patent Literature

PTL: JP 10-339751 A

SUMMARY OF INVENTION

Technical Problem

However, there are the following problems in the above related art.

For example, in order to maintain measurement accuracy in a positioning control device using digital control, measurement is theoretically required until half of a sampling frequency (Nyquist frequency) of a positioning control system. However, when the sampling frequency is inhibited, for example, in order to shorten measurement time, in particular, the measurement accuracy of frequency characteristics is degraded in a high frequency region. Prolonging data acquisition time at each frequency can improve the measurement accuracy of the frequency characteristics. However, there is no indicator for to what extent the data acquisition time is set. Thus, it is thought that there is a case where the measurement time is unnecessarily long or a case where the measurement time is insufficient to acquire necessary measurement accuracy.

In the above related art, data acquisition time for analyzing frequency characteristics of gain and the phase, is constant. Thus, there is a risk that the measurement accuracy in a high frequency region is degraded. Furthermore, since the data acquisition and the analysis are repeated in order to improve the accuracy of the frequency-characteristics measurement, the measurement time is required to be extremely long.

The present invention has been made in consideration of the above problems. An object of the invention is to provide a positioning control device and a frequency-characteristics measurement method that are capable of preventing measurement time of frequency characteristics from being prolonged, and optimizing measurement accuracy.

Solution to Problem

In order to achieve the above object, the present invention includes: a signal applying unit configured to apply a sinusoidal signal to a control system in a movement device that moves an object to be moved, the sinusoidal signal being frequency-swept so as to have a frequency region in which at least one of a cycle number and applying duration is different at each frequency; a time-series data acquisition unit configured to acquire time-series data of transmission characteristics acquired from the control system by applying the sinusoidal signal; and a spectrum analyzing unit configured to perform spectral analysis to the time-series data.

Advantageous Effects of Invention

According to the present invention, the measurement time of the frequency characteristics can be prevented from being prolonged and the measurement accuracy can be optimized.

DESCRIPTION OF EMBODIMENTS

Embodiments of the present invention will be described below with reference to the drawings.

First Embodiment

A first embodiment of the present invention will be described with reference to FIGS. 1 to 17.

Figure 1:
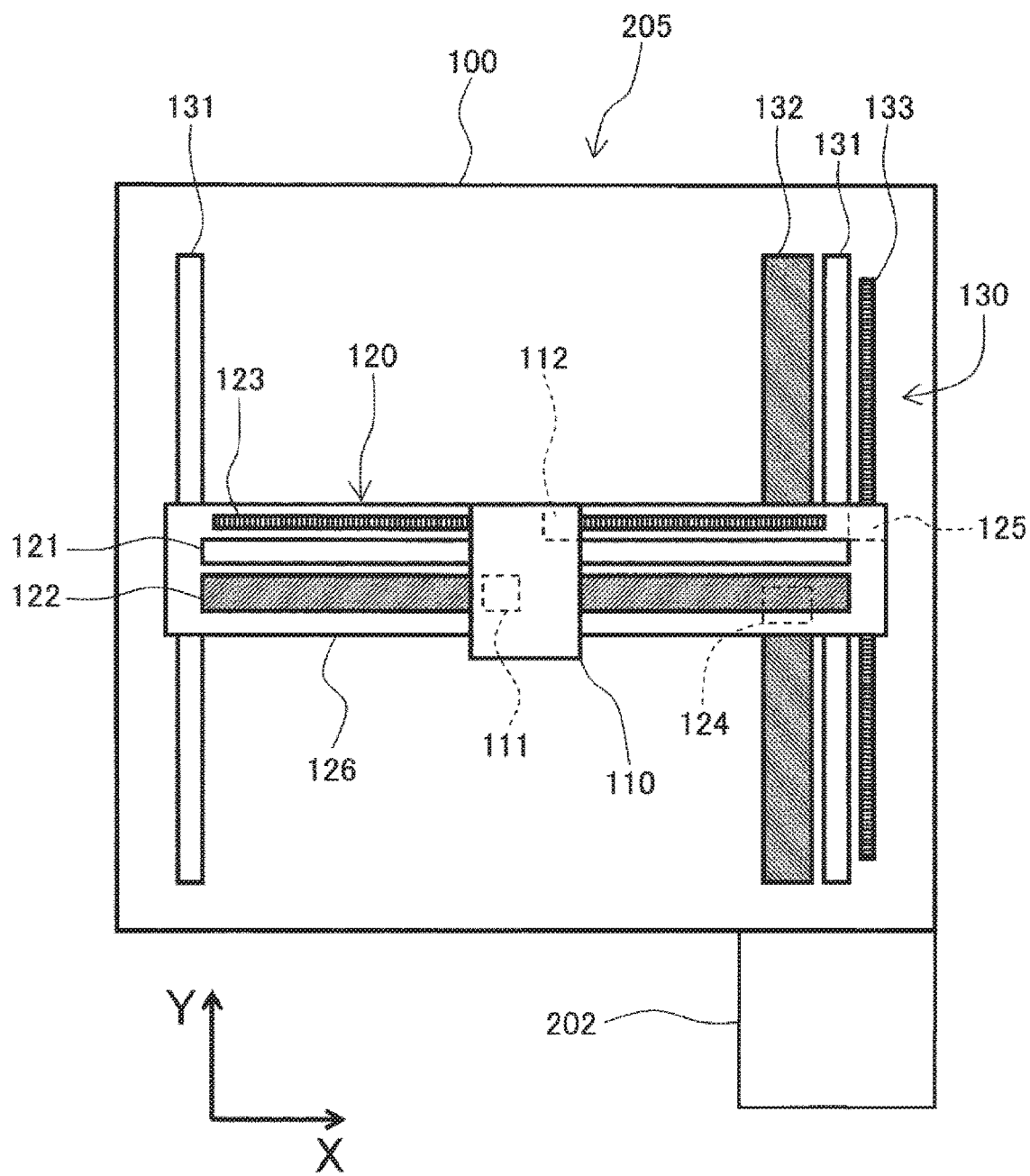
FIG. 1 is a schematic view of an entire configuration of a positioning control system according to a first embodiment.

FIG. 1 is a schematic view of an entire configuration of a positioning control system according to the present embodiment.

In FIG. 1, the positioning control system includes, a table driving device 205 illustrated as an example of an object to be controlled and an object to be measured according to the present embodiment, and the positioning control device 202 for controlling the positioning control system.

The table driving device 205 schematically includes a base table 100, a top table 110 as an object to be moved, an X axis direction driving mechanism 120 and a Y axis direction driving mechanism 130 included in a movement device for moving the top table 110.

The Y axis direction driving mechanism 130 includes a Y axis direction linear guide 131, a Y axis direction driving motor stator 132, and a Y axis direction linear scale 133 that are arranged in a Y axis direction on the base table 100. The Y axis direction linear guide 131 includes a sliding unit, not illustrated, fit thereto. The sliding unit guides a movement of a Y table 126 of the X axis direction driving mechanism 120 in the Y axis direction. A Y axis direction motor needle 124 disposed on the Y table 126 is driven with respect to the Y axis direction motor stator 132 so that the Y table 126 can be driven along the Y axis direction linear guide 131. A Y scale head 125 disposed on the Y table 126 detects the Y axis direction linear scale 133 so that a position (coordinates) of the Y table 126 in the Y axis direction can be detected. Note that, the Y axis direction linear scale 133 and the Y scale head 125 are included in a portion of a position detecting device for detecting a position of the top table 110 that is an object to be moved.

The X axis direction driving mechanism 120 includes an X axis direction linear guide 121, an X axis direction driving motor stator 122, and an X axis direction linear scale 123 that are arranged in an X axis direction on the Y table 126. The X axis direction linear guide 121 includes a sliding unit, not illustrated, fit thereto. The sliding unit guides a movement of the top table 110 in the X axis direction. An X axis direction motor needle 111 disposed on the top table 110 is driven with respect to the X axis direction motor stator 122 so that the top table 110 can be driven along the X axis direction linear guide 121. An X scale head. 112 disposed on the top table 110 detects the X axis direction linear scale 123 so that a position (coordinates) of the top table 110 in the X axis direction can be detected.

Figure 2:
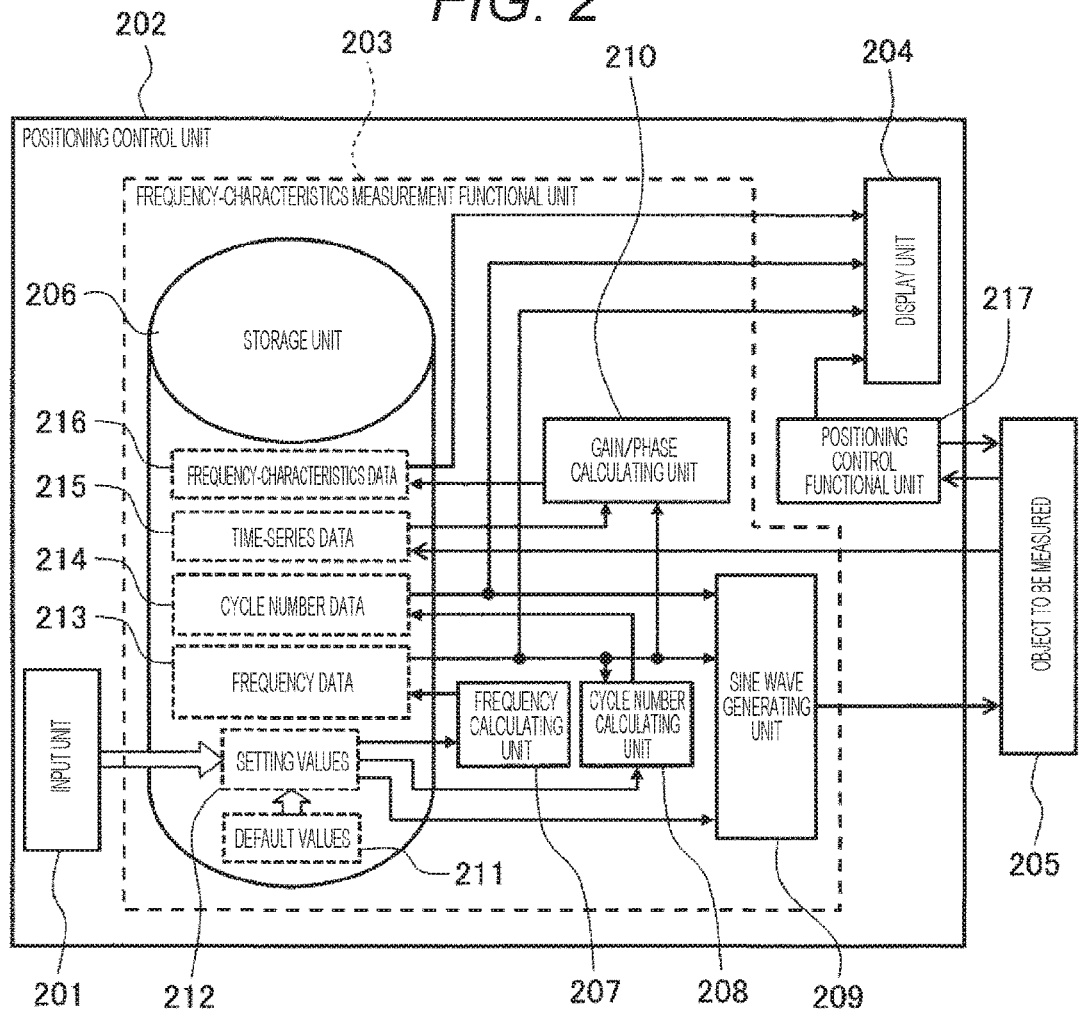
FIG. 2 is a schematic view of an entire configuration of a positioning control device according to the first embodiment.
Figure 3:
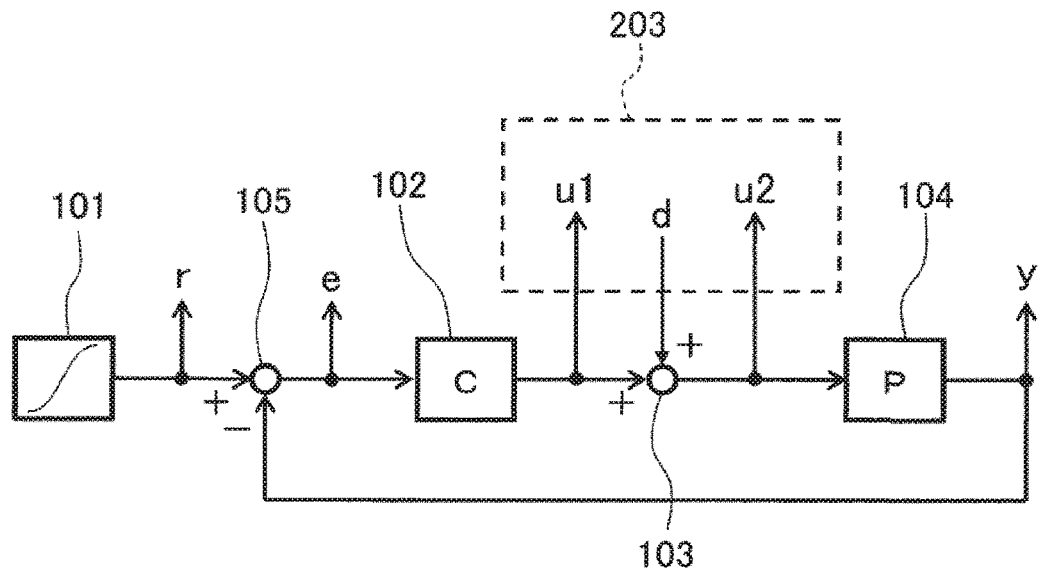
FIG. 3 is an exemplary block diagram of a control system in the positioning control device.

FIG. 2 is a schematic view of an entire configuration of the positioning control device according to the present embodiment. FIG. 3 is an exemplary block diagram of a control system in the positioning control device.

As illustrated in FIG. 3, the control system in the positioning control device includes: for example, an object to be controlled 104 corresponding to the direction driving mechanism 120 and the Y axis direction driving mechanism 130 of the object to be measured 205; a command generating unit 101 for generating and outputting a position command r using previously set movement parameters, such as a target movement amount, velocity, and acceleration; a differentiator 105 for outputting a difference e between the position command r that is the output of the command generating unit 101 and a current position y that is output of the object to be controlled 104, to a controller 102; the controller 102 for calculating and outputting an operation amount u1 with respect to the object to be controlled 104; and an adder 103 for outputting an operation amount u2 that is the sum of the operation amount u1 that is the output of the controller 102 and a virtual thrust disturbance d, to the object to be controlled 104. For example, the command generating unit 101, the controller 102, and the differentiator 105 correspond to constituent functions of positioning control functional unit 217 to be described later.

Transmission characteristics from the thrust disturbance d to the operation amount u2 are referred to as a sensitivity function, and are expressed by a transmission function in Mathematical Formula 1 below.

$$G_S = \frac{u_2}{d} = \frac{1}{1+C \cdot P}$$ [Mathematical Formula 1]

Transmission characteristics from the thrust disturbance d to the operation amount u1 are referred to as a complementary sensitivity function, and are expressed by transmission characteristics in Mathematical Formula 2 below.

$$G_{cS} = \frac{u_1}{d} = \frac{C \cdot P}{1+C \cdot P} = 1 - G_S$$ [Mathematical Formula 2]

Transmission characteristics from the operation amount u2 to the operation amount u1 are referred to as open loop characteristics, and are expressed by transmission characteristics in Mathematical Formula 3 below.

$$G_L = \frac{u_1}{u_2} = C \cdot P = \frac{G_{cS}}{G_S} = \frac{1}{G_S} - 1$$ [Mathematical Formula 3]

In a case where the operation amount u2 and the current position y have been extracted in a state where the operation amount u1 has been made to be zero by, for example, the controller 102 (control has not been performed), transmission characteristics from the operation amount u2 to the current position y are referred to as object-to-be-controlled characteristics, and are expressed by a transmission function in Mathematical Formula 4 below in a state where the operation amount u1 has been made not to be zero (the control has been performed), the transmission characteristics from the operation amount u2 to the current position y are referred to as a setting function, and are expressed by the product of the sensitivity function and the object-to-be-controlled characteristics as in Mathematical Formula 5 below. That is, in this case, characteristics of the object to be controlled 104 can be calculated by the setting function and the sensitivity function.

$$G_P = \frac{y}{d} = P$$ [Mathematical Formula 4]

$$G_{St} = \frac{y}{d} = \frac{P}{1+C \cdot P} = C_S \cdot P$$ [Mathematical Formula 5]

Typically, the open loop characteristics are used for evaluating stability of the control system. The sensitivity function is used for evaluating disturbance suppression characteristics, and the complementary sensitivity function is used for evaluating response characteristics. Therefore, the open loop characteristics, the sensitivity function, and the complementary sensitivity function are measured so that the control system can be evaluated and a parameter of the controller 102 can be adjusted. The object-to-be-controlled characteristics are measured so that a structure and the parameter of the controller 102 can be designed and the control system can be constructed.

Note that, the block diagram of the uniaxial control system is only illustrated in FIG. 3 in order to simplify the descriptions. For a multiaxial control system, interference between axes is prevented so that a control system of each axis includes the same block. Furthermore, for an object to be controlled (object to be measured) of a multiple input/output system including a plurality of inputs or outputs, a control system of each pair of the input and the output includes the same block.

The positioning control system illustrated in FIG. 3 is only an example. For example, a configuration of the positioning control system according to the present embodiment is not limited to this. That is, for example, the input of the controller 102 may include the operation amounts u1 and u2, the current position y, and the position command r in addition to the difference e. Various configurations can be arranged for purposes. Similarly, FIG. 3 is exemplary transmission characteristics necessary for designing and adjusting the controller 102, and, for example, a configuration of the object to be measured is not limited to this. That is, in a case where transmission characteristics between two points of an object to be controlled is measured, a virtual disturbance may be applied and a quantity of state of each of the two points may be extracted so that the transmission characteristics may be measured. Selection can be freely performed for purposes.

In FIG. 2, the positioning control device 202 schematically includes: a display unit 204 for displaying various information and a setting screen; an input device 201 for inputting the various information and setting values; the positioning control functional unit 217 for controlling a movement of the object to be measured 205 (the table driving device 205 in FIG. 1: hereinafter, simply referred to as the object to be measured 205); and a frequency-characteristics measurement functional unit 203 for measuring frequency characteristics of the object to be measured 205.

The positioning control functional unit 217 controls movements of the X axis direction driving mechanism 120 and the Y axis direction driving mechanism 130 of the object to be measured (table driving device) 205 so as to move the top table 110. Then, the positioning control functional unit 217 performs positioning of the top table 110 with respect to the base table 100.

The frequency-characteristics measurement function 203 includes a storage unit. 206, a frequency calculating unit 207, a cycle-number calculating unit 208, a sine wave generating unit (signal applying unit) 209, and a gain/phase calculating unit 210.

The storage unit 206 stores: setting values 212, such as a sine wave applying unit and an output signal corresponding to transmission characteristics required to be measured, a frequency range and a frequency interval to be measured, a sine-wave cycle-number and measurement time at each frequency, and a sine wave amplitude; various default values 211 previously set; frequency data 213, cycle-number data 214, and frequency-characteristics data 216 that are results calculated by the frequency calculating unit 207, the cycle-number calculating unit 208, and the gain/phase calculating unit 210; and time-series data 215 output from the object to be measured 205.

The frequency calculating unit 207 calculates the frequency data 213 based on, for example, the measurement frequency range and the number of frequency points included in the setting values 212 that are the default values 211, and then stores the frequency data 213 in the storage device 206.

The cycle-number calculating unit 208 calculates the cycle-number data 214 according to measurement at each frequency based on, for example, sampling time included in the setting values 212 and the frequency data 213, and stores the cycle-number data 214 in the storage device 206.

The sine wave generating unit 209 generates a sine wave determined based on the sine wave amplitude included in the setting values 212 and the frequency data 213, by a cycle number determined based on the cycle-number data 214. Then, the sine wave generating unit 209 applies the sine wave by the cycle number, to the object to be measured 205.

The gain/phase calculating unit 210 calculates the frequency-characteristics data 216 at a measurement frequency, based on the time-series data 215 and the frequency data 213, and stores the frequency-characteristics data 216 in the storage device 206.

The display unit 204 displays a cycle number at each frequency used for measurement and measured frequency characteristics, using, for example, the frequency data 213, the cycle-number data 214, and the frequency-characteristics data 216. Note that, the data to be displayed may be constituent for purposes, for example, may include the time-series data 215.

According to the present embodiment, the positioning control device having the above configuration measures target transmission characteristics of the object to be measured 205.

Here, frequency-characteristics measurement according to the present embodiment, will be described with reference to FIG. 4.

Figure 4:
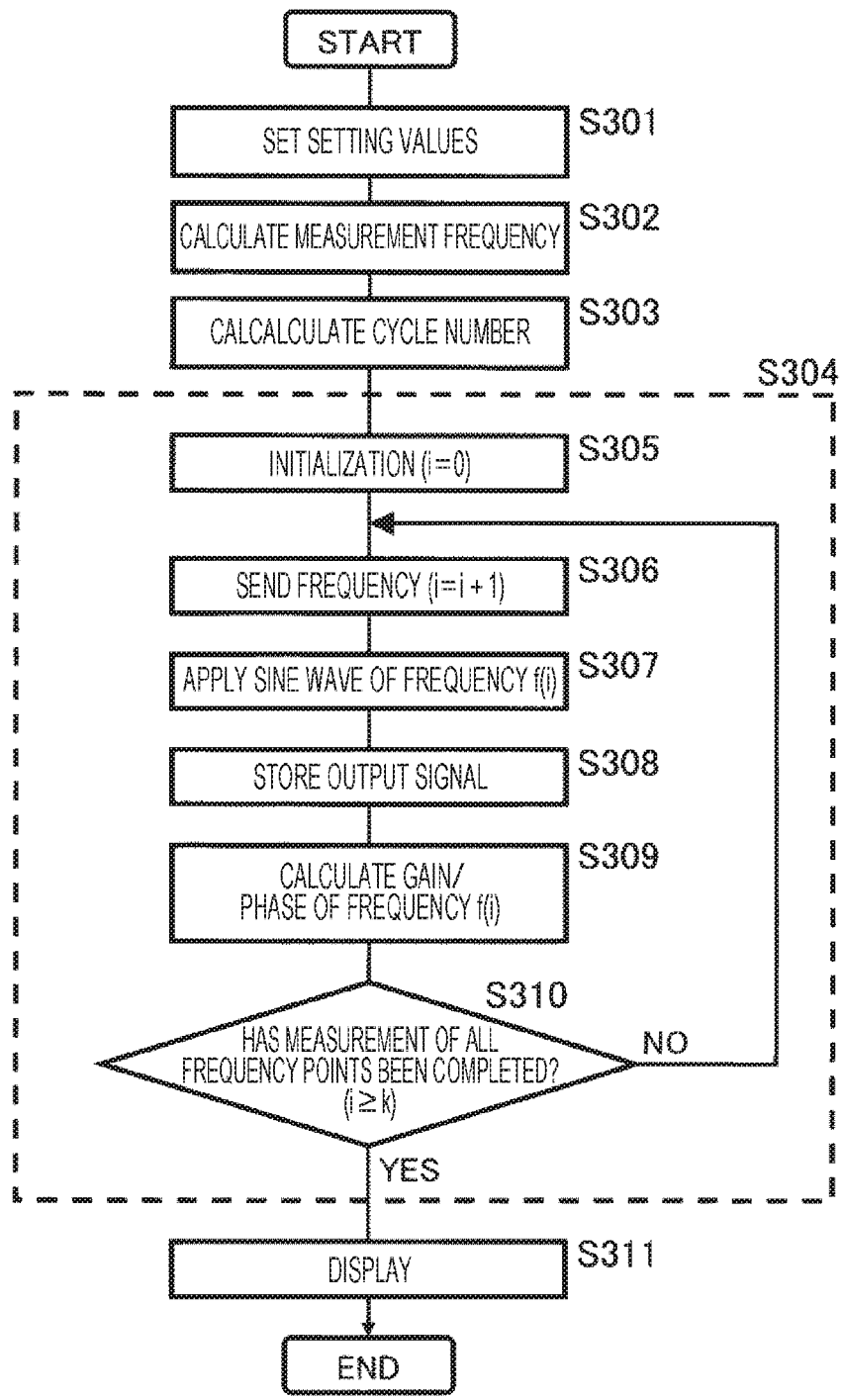
FIG. 4 is a flow chart of processes of frequency-characteristics measurement.

FIG. 4 is a flow chart of processes of the frequency-characteristics measurement.

In FIG. 4, first, a normal positioning movement is stopped in the frequency-characteristics measurement. An operator uses the input unit 201 so as to set setting values, such as a sine wave applying unit and an output signal corresponding to transmission characteristics required to be measured, a frequency range and a frequency interval to be measured, a sine-wave cycle-number and measurement time at each frequency, and a sine wave amplitude (Step S301).

For example, upon measuring the open loop characteristics in Mathematical Formula 3 above in the control system illustrated in FIG. 3, the sine wave applying unit should be set to be d, and the output signal should be set to be u1 and u2. Note that, the setting values each are set by an operator or a user. The default values stored in the device may be used for all the setting values or a part of the setting values.

Next, a frequency and the number of all frequency points k to be measured, are calculated based on, for example, the frequency range and the frequency interval that have been set (Step S302). A sine-wave cycle-number at each measurement frequency, is calculated and set (Step S303). The frequency-characteristics measurement is performed after the parameters have been set (Step S304). In the calculation of the sine-wave cycle-number at each measurement frequency at Step S303, a calculation is performed so as to have a frequency region in which at least one of a cycle number and applying duration is different at each frequency (to be described later).

In the frequency-characteristics measurement at Step S304, first, initialization of a sine wave to be applied for setting a frequency sending index i for determining the frequency to be measured, security of an output signal storage region, initialization necessary for the frequency-characteristics measurement, are performed (Step S305).

Next, the index i is updated so that the frequency to be measured is updated to be f(i) (Step S306). The sine wave generating unit applies a sine wave having the frequency f(i) and an amplitude set, to the object to be measured 205 (Step S307). An output signal in the measurement at the index i, stored (Step S308). Gain/phase characteristics at the index i are calculated (Step S09).

The gain characteristics g and the phase characteristics p of the signal can be calculated by Mathematical Formulae 6 and 7 below using a cosine wave component. Re and a sine wave component Im at the frequency f(i) of the output signal.

$$g = \sqrt{Re^2 + Im^2}$$ [Mathematical Formula 6]

$$p = Tan^{-1}\left(\frac{Im}{Re}\right)$$ [Mathematical Formula 7]

Similarly, for example, gain transmission characteristics Gt and phase transmission characteristics Pt from a signal A to a signal B, can be calculated by Mathematical Formulae 8 and 9 below using a cosine wave component ReA and a sine wave component ImA of the signal A and a cosine wave component ReB and a sine wave component ImB of the signal B.

$$Gt = \sqrt{\frac{ReB^2 + ImB^2}{ReA^2 + ImA^2}}$$ [Mathematical Formula 8]

$$Pt = Tan^{-1}\left(\frac{ImB}{ReB}\right) - Tan^{-1}\left(\frac{ImA}{ReA}\right)$$ [Mathematical Formula 9]
$$= Tan^{-1}\left(\frac{ReA \cdot ImB - ReB \cdot ImA}{ReA \cdot ReB + ImA \cdot ImB}\right)$$

Here, it is determined whether measurement of all frequencies to be measured that have been set has been completed (Step S310). In a case where a determined result is NO, the series of processing of Steps S306 to S309 is repeated until the determining result at Step S310 becomes YES. In a case where the determined result at Step S310 is YES, for example, the frequency characteristics that has been measured and the cycle number that has been calculated, are displayed on the display unit 204 (Step S311) after passing through Step S304. Then, the processing is completed.

Note that, in the frequency-characteristics measurement illustrated in FIG. 4, for example, the display at Step S311 may be configured to display every time a calculated result in the gain/phase calculation at Step S309 is output. The gain/phase calculating at Step S308 may be performed after the measurement of all frequencies has been completed, namely, after Step S304.

Here, the frequency-characteristics measurement according to the present embodiment will be described in detail in comparison with the related art.

Figure 5:
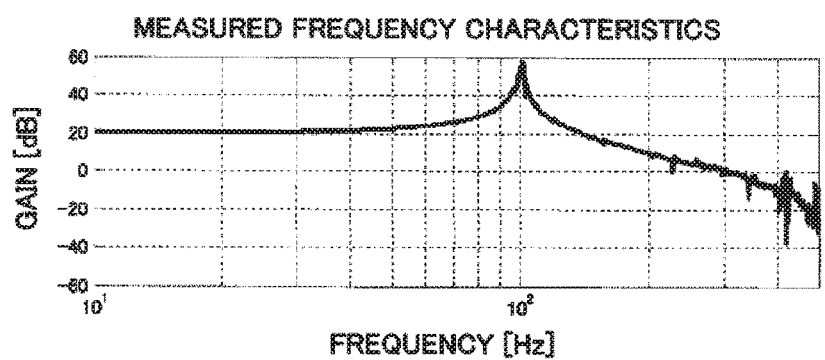
FIG. 5 is an exemplary graphical representation of a measurement result by a simulation of transmission characteristics in the related art, illustrating frequency characteristics relating to gain.
Figure 6:
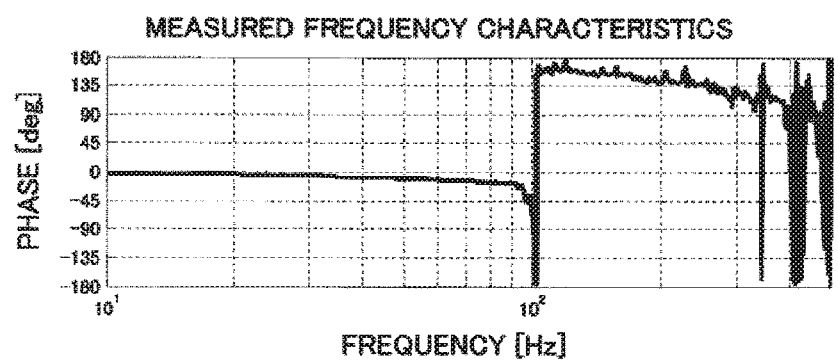
FIG. 6 is an exemplary graphical representation of a measurement result by the simulation of transmission characteristics in the related art, illustrating frequency characteristics relating to phase.
Figure 7:
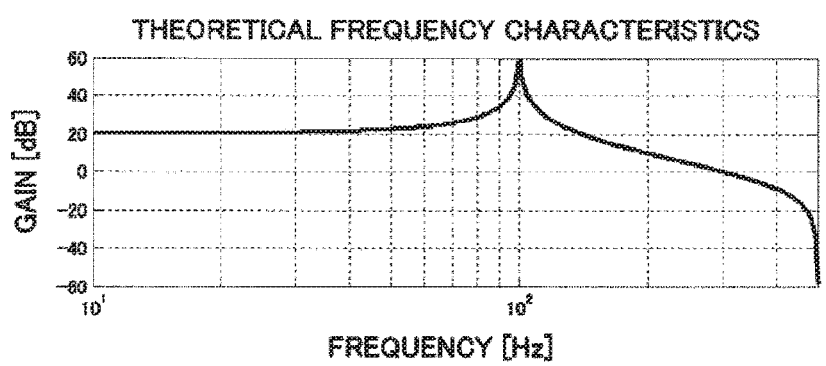
FIG. 7 is a graphical representation of a measurement result by a simulation of theoretical transmission characteristics, illustrating frequency characteristics relating to gain.
Figure 8:
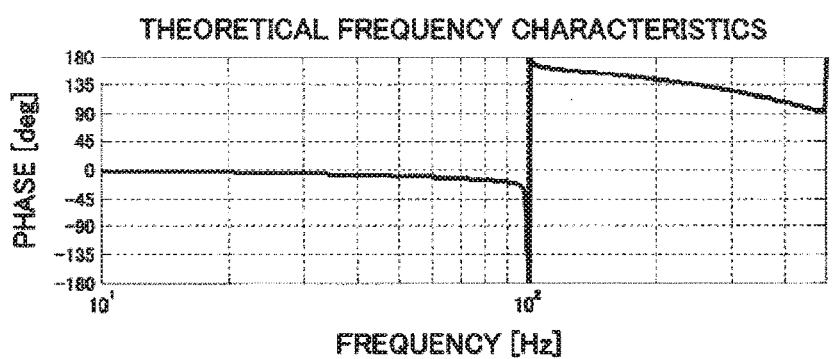
FIG. 8 is a graphical representation of a measurement result by the simulation of theoretical transmission characteristics, illustrating frequency characteristics relating to phase.

FIGS. 5 and 6 are exemplary graphical representations of measurement results by a simulation of transmission characteristics in the related art. FIG. 5 is the graphical representation of frequency characteristics relating to gain. FIG. 6 is the graphical representation of frequency characteristics relating to phase. FIGS. 7 and 8 are graphical representations of measurement results by a simulation of theoretical transmission characteristics. FIG. 7 is the graphical representation of frequency characteristics relating ng to gain. FIG. 8 is the graphical representation of frequency characteristics relating to phase.

In the related art illustrated in FIGS. 5 and 6, a measurement cycle number for each frequency has been made to be constant. A state where a sine wave to be applied and a signal to be output include no external noise, is provided. However, the transmission characteristics in the related art illustrated in FIGS. 5 and 6 have agreement in a low frequency region but difference in a high frequency region of more than 90 Hz in comparison with the theoretical transmission characteristics illustrated in FIGS. 7 and 8. Since a condition in which the signal to be applied and the output signal do not include the external noise, is provided, it is thought that the difference in the measurement results of transmission functions is caused by a measurement error due to discretization of the input/output signals.

Figure 9:
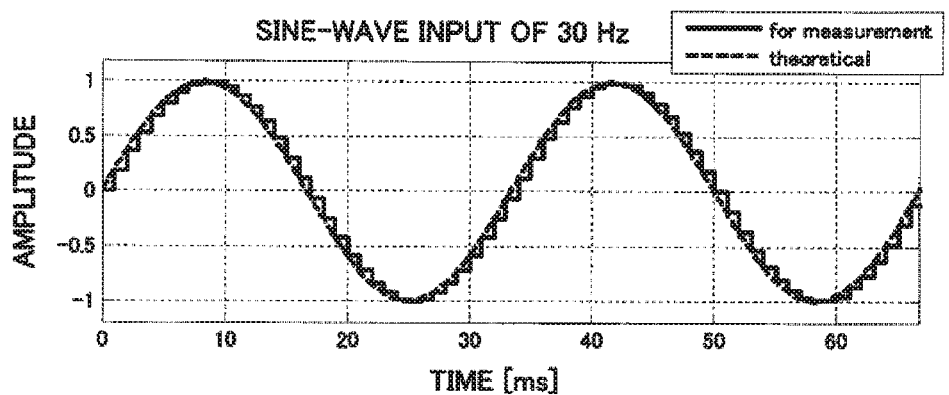
FIG. 9 is an exemplary graphical representation of discretization of a sinusoidal signal to be applied to an object to be measured, illustrating a case where the sine signal having 30 Hz is sampled with a frequency of 1 kHz.
Figure 10:
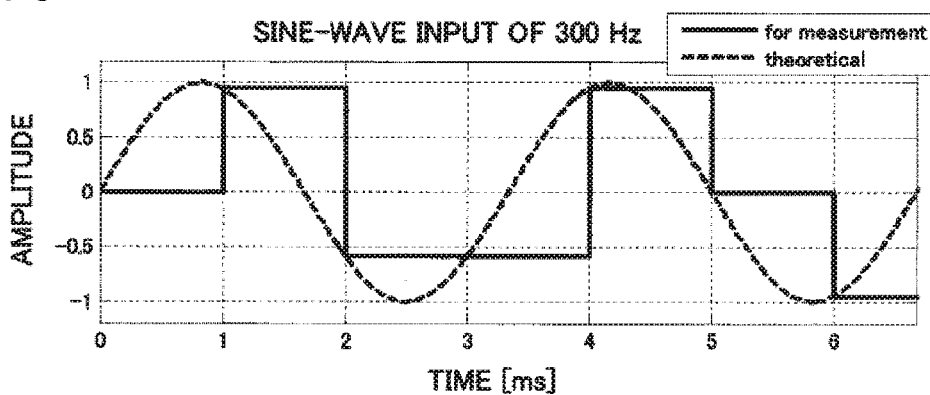
FIG. 10 is an exemplary graphical representation of discretization of a sinusoidal signal to be applied to the object to be measured, illustrating a case where the sine signal having 300 Hz is sampled with a frequency of 1 kHz.

FIGS. 9 and 10 are exemplary graphical representations of discretization of sinusoidal signals to be applied to an object to be measured. FIG. 9 illustrates a case where the sinusoidal signal having 30 Hz is sampled with a frequency of 1 kHz. FIG. 10 illustrates a case where the sinusoidal signal having 300 Hz is sampled with a frequency of 1 kHz.

As illustrated in FIG. 9, in a case where a frequency region of the sinusoidal signal (30 Hz) is relatively lower than the sampling frequency (1 kHz), the sine wave to be applied can be achieved to be substantially a theoretical sine wave. However, in a case where a frequency region of the sinusoidal signal (300 Hz) is relatively higher than the sampling frequency (1 kHz), the sine wave to be applied cannot be achieved to be a theoretical sine wave. That is, the disagreement between the sine wave after discretization and the theoretical sine wave, becomes noise caused by the discretization (discretization noise), and causes the measurement error illustrated in FIGS. 5 and 6.

Figure 11:
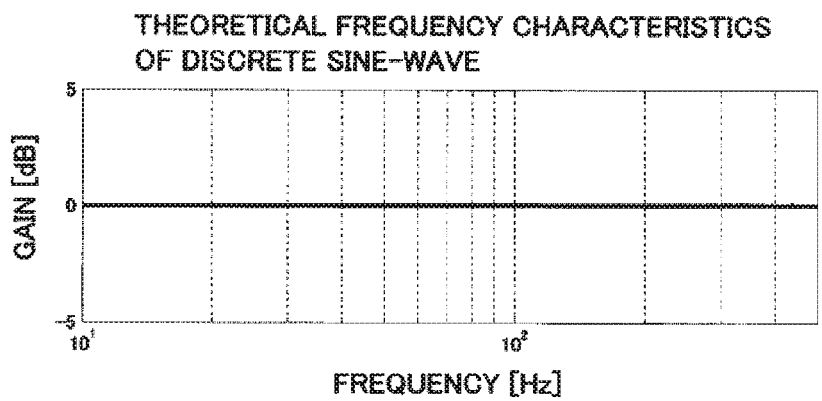
FIG. 11 is a graphical representation of a simulated result of ideal frequency characteristics including no discretization noise in a case where a sine wave having an amplitude of 1 is applied at each frequency, illustrating the frequency characteristics relating to gain.
Figure 12:
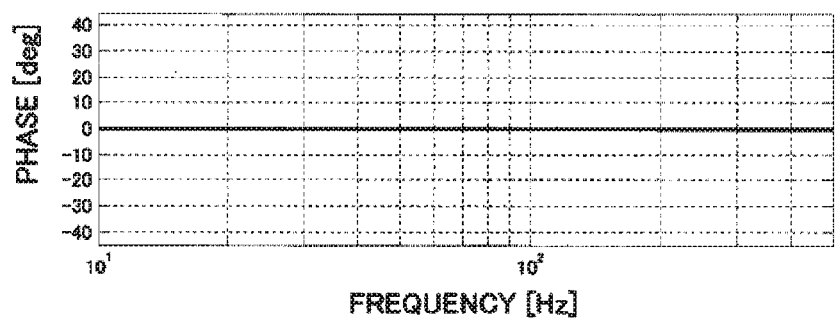
FIG. 12 is a graphical representation of a simulated result of ideal frequency characteristics including no discretization noise in a case where a sine wave having an amplitude of 1 is applied at each frequency, illustrating the frequency characteristics relating to phase.
Figure 13:
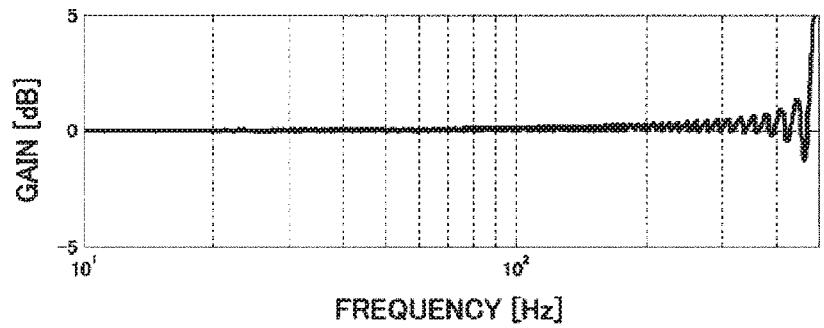
FIG. 13 is a graphical representation of a simulated result of frequency characteristics including discretization noise in a case where a cycle number has been made to be constant and a sine wave having an amplitude of 1 is applied at each frequency, illustrating the frequency characteristics relating to gain.
Figure 14:
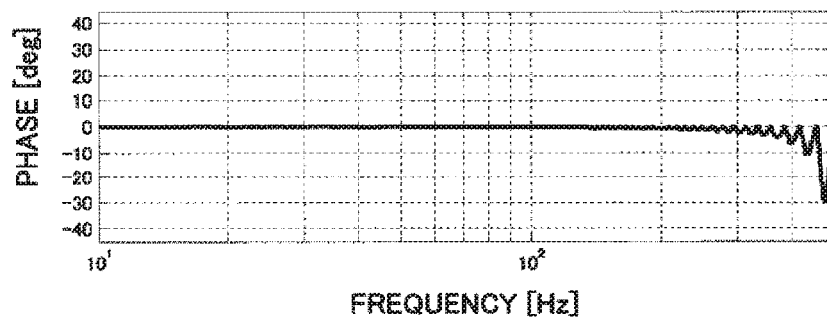
FIG. 14 is a graphical representation of a simulated result of frequency characteristics including discretization noise in a case where the cycle number has been made to be constant and a sine wave having an amplitude of 1 is applied at each frequency, illustrating the frequency characteristics relating to phase.

FIGS. 11 and 12 are graphical representations of ideal frequency-characteristics simulated results including no discretization noise in a case where a sine wave having an amplitude of 1 has been applied at each frequency. FIG. 11 is the graphical representation of the frequency characteristics relating to gain. FIG. 12 is the graphical representation of the frequency characteristics relating to phase. FIGS. 13 and 14 are graphical representations of simulated results of frequency characteristics including the discretization noise in a case where a cycle number has been made to be constant and a sine wave having an amplitude of 1 has been applied at each frequency. FIG. 13 illustrates the frequency characteristics relating to gain. FIG. 14 illustrates the frequency characteristics relating to phase.

As illustrated in FIGS. 11 to 14, it can be seen that the frequency characteristics of the applied sine wave are degraded in accuracy due to the discretization noise. Since the applied sine wave is output by the frequency-characteristics measurement function, the applied sine wave has been known. Therefore, according to the present embodiment, the measurement error of the applied sine wave due to the discretization noise is defined as an indicator, and a cycle number is calculated and used for the measurement. Thus, measurement accuracy is improved.

In FIGS. 13 and 14, gain characteristics G1 of the applied sine wave are expressed by Mathematical Formula 10 below. Here, N is a sample number (integer) of measurement time. A relationship between the sample number N and the cycle number C is expressed by Mathematical Formula 11 below. A relationship between the sample number N and the measurement time T is expressed by Mathematical Formula 12 below. Note that f is a measurement frequency and Ts is sample time in Mathematical Formulae 10 to 12.

$$G1 = \sqrt{\frac{\alpha n1 + \alpha n2 + \alpha n3 + \alpha n4 + \alpha n5}{\alpha d1}} \quad \text{[Mathematical Formula 10]}$$

where, $$\begin{cases} \alpha n1 = 4\sin^2\left(\frac{\theta}{2}\right)\left(1 + 2N(N+1)\sin^2\left(\frac{\theta}{2}\right)\right) \\ \alpha n2 = (N+1)\cos((N+1)\theta) \\ \alpha n3 = -(3N+2)\cos(N\theta) \\ \alpha n4 = (3N+1)\cos((N-1)\theta) \\ \alpha n5 = -N\cos((N-2)\theta) \\ \alpha d1 = 8N^2\sin^4\left(\frac{\theta}{2}\right) \\ \theta = 4\pi f \cdot Ts \end{cases}$$

$$C = N \cdot f \cdot Ts \quad \text{[Mathematical Formula 11]}$$

$$T = N \cdot Ts \quad \text{[Mathematical Formula 12]}$$

In the applied sine wave, gain characteristics including no discretization noise become amplitude, and thus have been known. Therefore, when a measurement error tolerated by the gain characteristics G1 is made to be defined as an indicator, only the sample number N is an unknown variable in Mathematical Formula 10 above. Mathematical Formula 10 above is solved with respect to the sample number N so that the cycle number C at each frequency is acquired by Mathematical Formula 11 above. Similarly, the measurement time T at each frequency is acquired by Mathematical Formula 12 above. Here, a method for solving Mathematical Formula 10 above with respect to the sample N may be any of an analytical solution and a numerical solution. Furthermore, Mathematical Formula 10 may be solved with respect to an approximate expression thereof. A cycle number to be used may be the cycle number C acquired, by Mathematical Formula 11 above, or more. Measurement time to be used may be the measurement time T acquired by Mathematical Formula 12 above, or more.

According to the present embodiment, the cycle number or the measurement time that have been calculated above is used so that the frequency characteristics with high accuracy can be measured in a short time.

Note that, according to the present embodiment, the gain characteristics of the applied sine wave have been illustrated in Mathematical Formula 10 above, but a calculating method and an expression are not limited to the gain characteristics. That is, for example, the signal to be used for the calculation may be an output signal. The characteristics to be used may be phase characteristics.

Figure 15:
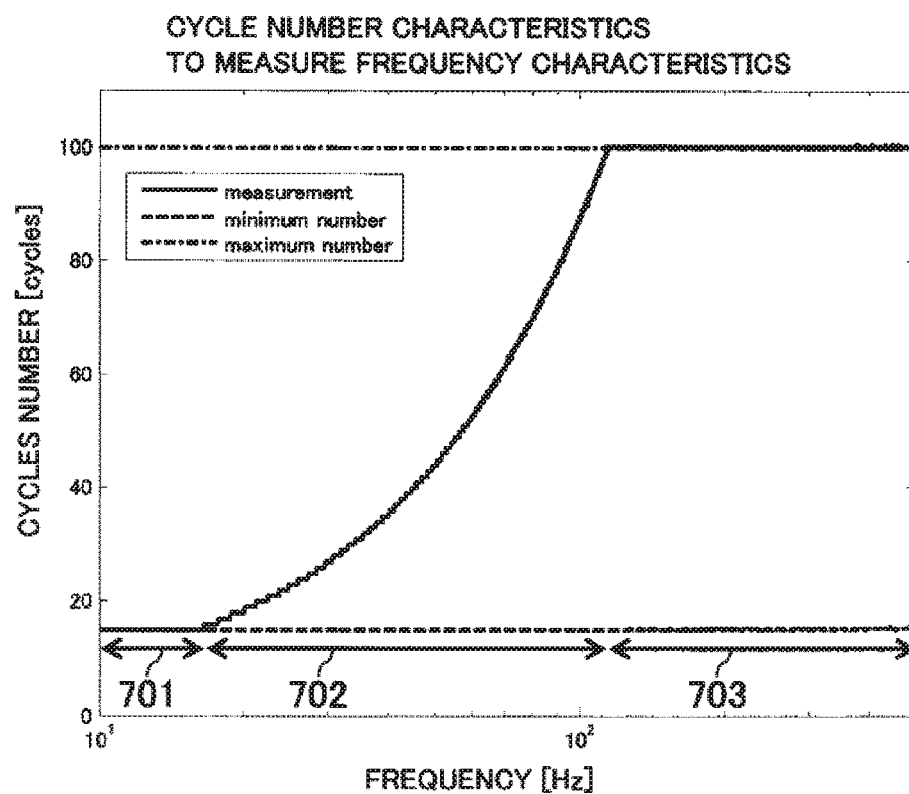
FIG. 15 is a graphical representation of the cycle number upon frequency-characteristics measurement according to the first embodiment.

FIG. 15 is a graphical representation of the cycle number upon the frequency-characteristics measurement according to the present embodiment.

FIG. 15 has been calculated by Mathematical Formula 10 above, and includes a frequency region 701 in which the cycle number is constant at the minimum cycle number set, a frequency region 702 in which the cycle number is variable, and a frequency region 703 in which the cycle number is constant at the maximum cycle number set.

The minimum cycle number Cmin is set in consideration of external noise. In a case where the cycle number C acquired by Mathematical Formula 10 above is less than the minimum cycle number Cmin (C<Cmin), a cycle number Cm to be used for the measurement is made to be Cmin (Cm=Cmin). Accordingly, the frequency region 701 in which the cycle number Cm is constant in the low frequency region, can be made.

The maximum cycle number Cmax is set from entire measurement time or a frequency region in which measurement accuracy is secured. In a case where the cycle number C acquired by Mathematical Formula 10 above is the maximum cycle number Cmax or less (C≤Cmax), the cycle number Cm to be used for the measurement is made to be the cycle number C (Cm=C). In a case where the cycle number C exceeds the maximum cycle number Cmax (C>Cmax) the cycle number Cm to be used for the measurement is made to be the maximum cycle number Cmax (Cm=Cmax). Accordingly, the frequency region 703 in which the cycle number Cm is constant in the high frequency region, can be made, and the region 702 in which the cycle number Cm is variable, can be made.

Note that cycle-number characteristics are not limited to FIG. 15. That is, the minimum cycle number and the maximum cycle number may be arbitrarily determined. In a case where there are one or more frequency regions each in which the cycle number is variable, the number of frequency regions in which the cycle number is fixed may be zero or more. Furthermore, the same may be true of the measurement time.

Figure 16:
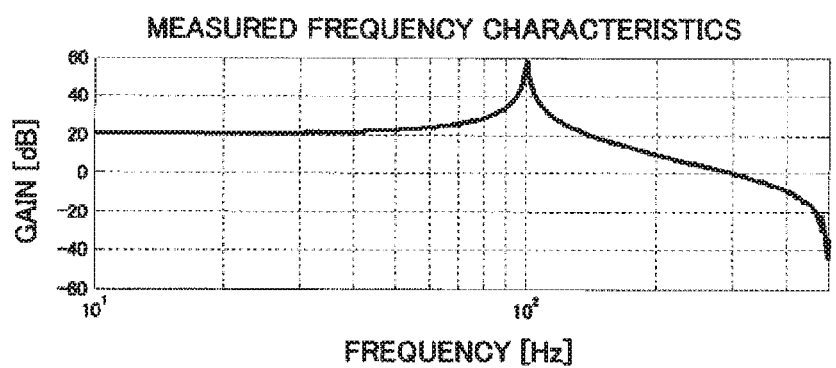
FIG. 16 is an exemplary graphical representation of a measurement result by a simulation of transmission characteristics according to the first embodiment, illustrating frequency characteristics relating to gain.
Figure 17:
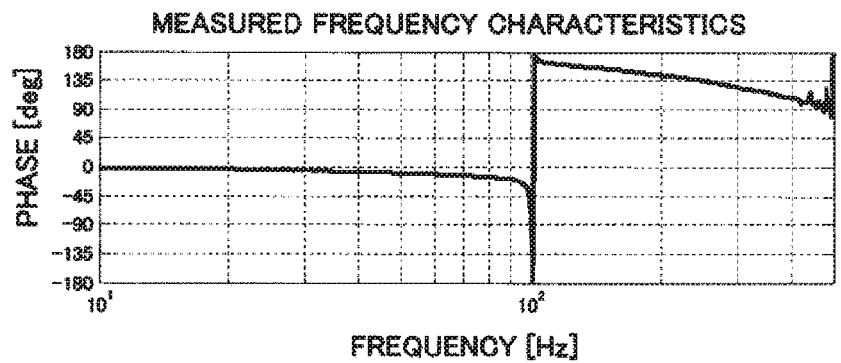
FIG. 17 is an exemplary graphical representation of a measurement result of the simulation of transmission characteristics according to the first embodiment, illustrating frequency characteristics relating to phase.

FIGS. 16 and 17 are exemplary graphical representations of measured results of a simulation of transmission characteristics according to the present embodiment. FIG. 16 is the graphical representation of frequency characteristics relating to gain. FIG. 17 is the graphical representation of frequency characteristics relating to phase.

According to the present embodiment, since the measurement cycle number illustrated in FIG. 15 is used, there is agreement in a frequency region of up to 400 Hz as illustrated in FIGS. 16 and 17 in comparison with the theoretical transmission characteristics (refer to FIGS. 7 and 8). That is, it can be seen that the frequency characteristics with high accuracy can be measured according to the present embodiment in comparison with the transmission characteristics in the related art (refer to FIGS. 5 and 6). In other words, the frequency region in which the cycle number is variable is provided as in the present embodiment so that the frequency characteristics with high accuracy can be measured in a short time.

Effects according to the present embodiment including the above constituents, will be described.

Typically, in order to maintain measurement accuracy in a positioning control device using digital control, measurement is theoretically required until half of a sampling frequency (Nyquist frequency) of a positioning control system. However, when the sampling frequency is inhibited, for example, in order to shorten measurement time, in particular, the measurement accuracy of frequency characteristics is degraded in a high frequency region. Prolonging data acquisition time at each frequency can improve the measurement accuracy of the frequency characteristics. However, there is no indicator for to what extent the data acquisition time is set. Thus, it is thought that there is a case where the measurement time is unnecessarily long or a case where the measurement time is insufficient to acquire necessary measurement accuracy.

For example, two methods can be considered in order to reduce a measurement error due to discretization noise and improve measurement accuracy. One method shortens sampling time as a reference of discretization, improves feasibility of a signal even in a high frequency region, and reduces discretization noise so as to improve the measurement accuracy. However, sampling time, as a control period, for positioning control is used in the positioning control device. Therefore, even when sampling time shorter than the control period is achieved for the frequency-characteristics measurement, actual sampling time becomes the control period in a control loop. Thus, no effect can be expected. Another method increases a cycle number to be used for the measurement and increase signal intensity of a measurement frequency so as to improve the measurement accuracy. That is, increasing the cycle number is effective for the noise-resistant frequency-characteristics measurement. However, since discretization noise and external noise are unified and dealt with in the known art, there is no indicator for setting the cycle number or the measurement time. This is because external noise depends on a measurement environment and cannot be previously determined.

In the related art, data acquisition time for analyzing frequency characteristics of gain and phase is constant. Thus, there is a risk that measurement accuracy is degraded in a high frequency region. Furthermore, since data acquisition and analysis are repeated in order to improve accuracy of the frequency-characteristics measurement, extremely long measurement time is required.

In contrast, according to the present embodiment, a sine wave frequency-swept so as to have the frequency region in which at least one of the cycle number or applying duration as different at each frequency, has been made to be applied to the control system in the movement device for moving the object to be moved. The measurement time of the frequency characteristics can be prevented from being prolonged and the measurement accuracy can be optimized. The frequency characteristics with high accuracy can be measured in a short time.

Second Embodiment

A second embodiment of the present invention will be described with reference to FIG. 18.

According to the present embodiment, the positioning control device according to the first embodiment has been applied to a component mounting device as a positioning control system. The component mounting device includes a positioning control device 202 that controls operation of the component mounting device and measures frequency characteristics of the component mounting device.

Figure 18:
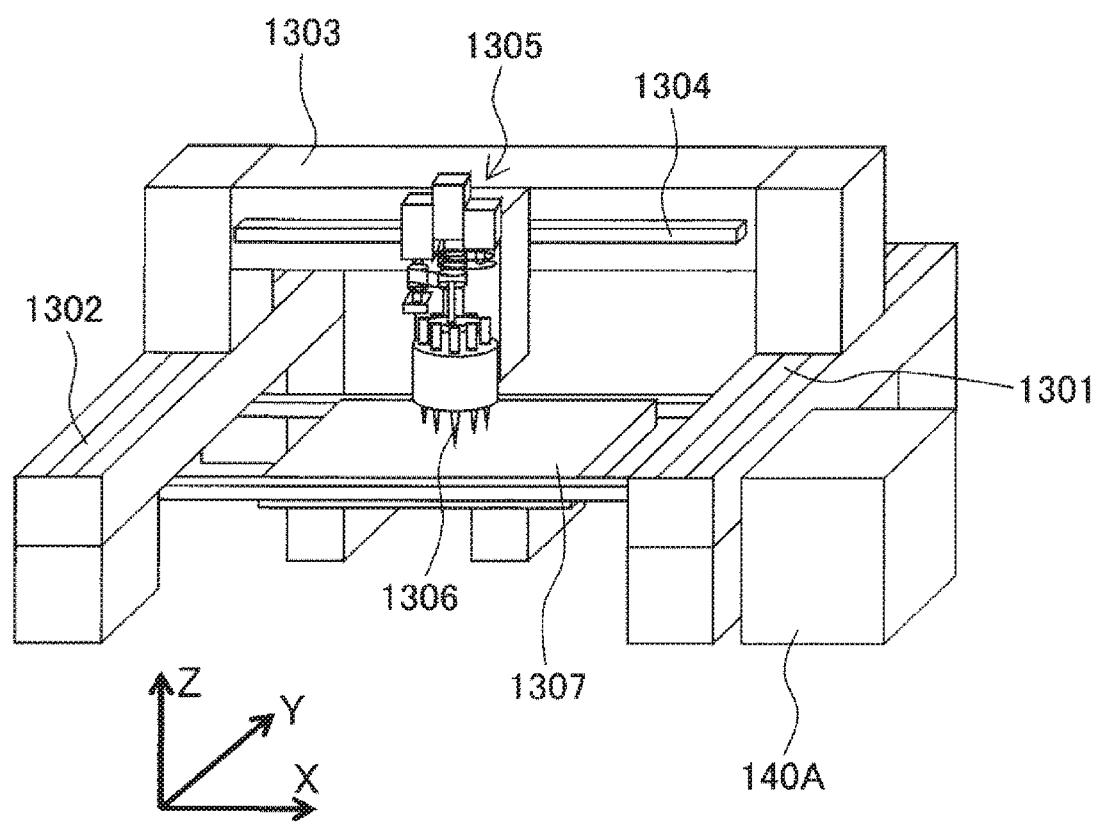
FIG. 18 is a schematic view of an entire configuration of a component mounting device according to a second embodiment.

FIG. 18 is a schematic view of an entire configuration of the component mounting device according to the present embodiment.

In FIG. 18, a Y beam 1303 movable in a Y axis direction in the drawing, is driven and positioned by two Y linear motors 1301 and 1302 in the Y axis direction with respect to a base. Similarly, a mounting head 1305 is driven and positioned by an X linear motor 1304 in an X axis direction with respect to the Y beam 1303. Accordingly, the mounting head 1305 is freely positioned on an XY plane. The mounting head 1305 includes a plurality of suction nozzles 1306. Each of the plurality of suction nozzles 1306 sucks, holds a component, and is moved in a Z direction so as to mount the component on an arbitrary position on a printed circuit board 1307.

Other components are similar to those according to the first embodiment.

According to the present embodiment including the above configuration, an effect similar to that according to the first embodiment, can be acquired.

Third Embodiment

A third embodiment of the present invention will be described with reference to FIG. 19.

According to the present embodiment, the positioning control device according to the first embodiment has been applied to a semiconductor manufacturing/inspection device as a positioning control system. The semiconductor manufacturing/inspection device includes a positioning control device 202 that controls operation of the semiconductor manufacturing/inspection device and measures frequency characteristics of the semiconductor manufacturing/inspection device.

Figure 19:
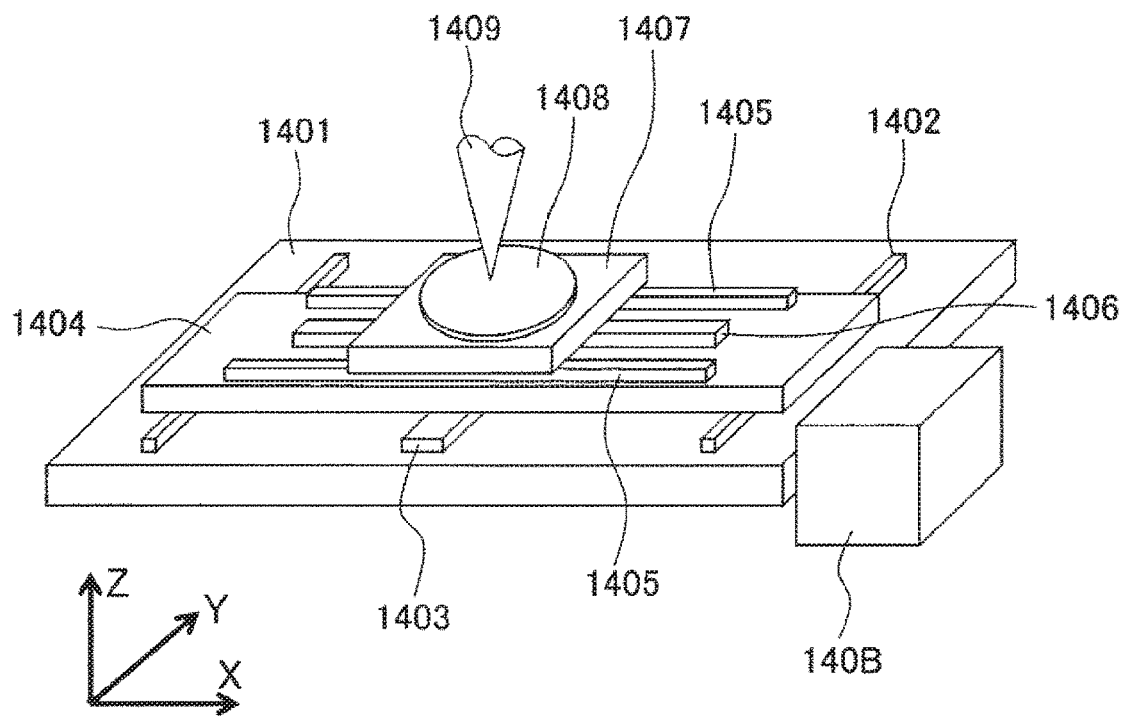
FIG. 19 is a schematic view of an entire configuration of a semiconductor manufacturing/inspection device according to a third embodiment.

FIG. 19 is a schematic view of an entire configuration of the semiconductor manufacturing/inspection device according to the present embodiment.

In FIG. 19, a Y linear guide 1402 is disposed in a Y axis direction in the drawing on a base 1401. A Y table 1404 is restricted so as to be free only in the Y axis direction. The Y table 1404 is positioned in the Y axis direction by a Y linear motor 1403. A top table 1407 is restricted by an X linear guide 1405 so as to be free only in an X axis direction with respect to the Y table 1404. The top table 1407 is positioned in the K axis direction by an X linear motor 1406. Accordingly, a wafer 1408 disposed on the top table 1407 is positioned in the KY axes directions with respect to the base 1404. For example, an optical beam or an electron beam 1409 for the semiconductor manufacturing or the inspection on is irradiated on the wafer 1408 so that the semiconductor manufacturing and inspection are performed.

Other components are similar to those according to the first embodiment.

According to the present embodiment including the above configuration, an effect similar to that according to the first embodiment, can be acquired.

Fourth Embodiment

Figure 20:
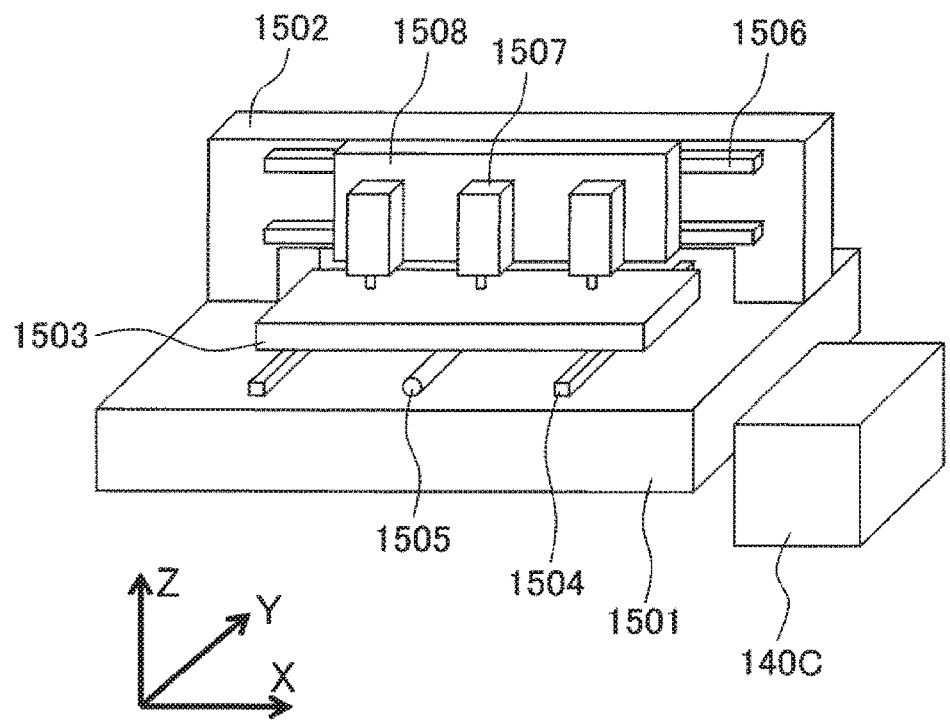
FIG. 20 is a schematic view of an entire configuration of a printed circuit board processing device according to a fourth embodiment.

A fourth embodiment according to the present invention will be descried with reference to FIG. 20.

According to the present embodiment, the positioning control device according to the first embodiment has been applied to a printed circuit board processing device as a positioning control system. The printed circuit board processing device includes a positioning control device 202 that controls operation of the printed circuit board processing device and measures frequency characteristics of the printed circuit board processing device.

FIG. 20 is a schematic view of an entire configuration of the printed circuit board processing device according to the present embodiment.

In FIG. 20, a table 1503 is disposed on a bed. 1 through two guides 1504 so as to be free in a Y axis direction in the drawing. A Y feed screw 1505 positions the table 3 in the Y axis direction. A portal-typed column rail 1502 is disposed on the bed 1501. A sliding ng plate 1508 is fit to a side surface of the portal-typed column rail 1506 through an K guide 1506. The sliding plate 1508 is positioned in an X axis direction with respect to the portal-typed column rail 1506 by an X driving unit (not illustrated). Accordingly, the sliding plate 1508 and the table 1503 are relatively positioned in the XY axes directions. A plurality of drill units 1507 are disposed on the sliding plate 1508, and performs processing of a printed circuit board disposed on the table 1503.

Other components are similar to those according to the first embodiment.

According to the present embodiment including the above configuration, an effect similar to that according to the first embodiment, can be acquired.

REFERENCE SIGNS LIST

100 base table
110 top table
111 X axis direction motor needle
120 X axis direction driving mechanism
121 X axis direction linear guide
122 X axis direction driving motor stator
123 X axis direction linear scale
124 Y axis direction driving motor needle
125 scale head
126 Y table
130 Y axis direction driving mechanism
131 Y axis direction linear guide
132 Y axis direction driving motor stator
133 Y axis direction linear scale
201 input device
202 positioning control device
203 frequency-characteristics measurement functional unit
204 display unit
205 object to be measured (table driving device)
206 storage unit
207 frequency calculating unit
208 cycle-number calculating unit
209 sine wave generating unit (signal applying unit)
210 gain/phase calculating unit
211 default values
212 setting values
213 frequency data
214 cycle-number data
215 time-series data
216 frequency-characteristics data
217 positioning control functional unit

The invention claimed is:

1. A positioning control device comprising:
a signal applying unit that outputs a sinusoidal signal to a table driving device in a control system, including an x-axis driving mechanism and a y-axis driving mechanism, that moves a table in an x-axis direction and a y-axis direction, the sinusoidal signal being frequency-swept so as to have a frequency region in which at least one of a cycle number and applying duration is different at each frequency;
a time-series data acquisition unit configured to acquire time-series data of transmission characteristics acquired from the control system by applying the sinusoidal signal to the table driving device to move the table in the x-axis direction and the y-axis direction with the x-axis driving mechanism and the y-axis driving mechanism; and
a spectrum analyzing unit configured to perform spectral analysis of the time-series data acquired from the control system;
wherein the signal applying unit performs a frequency-sweep so as to have at least one frequency region in which a cycle number of the sinusoidal signal is constant and at least one frequency region in which the cycle number of the sinusoidal signal is different at each frequency.

2. The positioning control device according to claim 1, wherein the cycle number in the frequency region in which the cycle number of the sinusoidal signal is constant, is settable by an operator.

3. The positioning control device according to claim 1, wherein the cycle number in the frequency region in which the cycle number of the sinusoidal signal is constant, is determined based on frequency-sweep time of the sine wave applying unit that has been previously determined.

4. The positioning control device according to claim 1, comprising a display unit configured to display the cycle number or the duration of the sinusoidal signal at each frequency.

5. A component mounting device comprising the positioning control device of claim 1.

6. A semiconductor manufacturing inspection device comprising the positioning control device of claim 1.

7. A substrate processing device comprising the positioning control device of claim 1.

8. A positioning control device comprising:
a signal applying unit that outputs a sinusoidal signal to a table driving device in a control system, including an x-axis driving mechanism and a y-axis driving mechanism, that moves a table in an x-axis direction and a y-axis direction, the sinusoidal signal being frequency-swept so as to have a frequency region in which at least one of a cycle number and applying duration is different at each frequency;
a time-series data acquisition unit configured to acquire time-series data of transmission characteristics acquired from the control system by applying the sinusoidal signal to the table driving device to move the table in the x-axis direction and the y-axis direction with the x-axis driving mechanism and the y-axis driving mechanism; and
a spectrum analyzing unit configured to perform spectral analysis of the time-series data acquired from the control system;
wherein the signal applying unit performs a frequency-sweep so as to have at least one frequency region in which the applying duration of the sinusoidal signal is constant and at least one frequency region in which the applying duration of the sinusoidal signal is different at each frequency.

9. The positioning control device according to claim 8, wherein the applying duration in the frequency region in which the applying duration of the sinusoidal signal is constant, is settable by an operator.

10. The positioning control device according to claim 8, wherein the applying duration in the frequency region in which the applying duration of the sinusoidal signal is constant, is determined based on frequency-sweep time of the sine wave applying unit that has been previously determined.

11. A positioning control device comprising:
a signal applying unit that outputs a sinusoidal signal to a table driving device in a control system, including an x-axis driving mechanism and a y-axis driving mechanism, that moves a table in an x-axis direction and a y-axis direction, the sinusoidal signal being frequency-swept so as to have a frequency region in which at least one of a cycle number and applying duration is different at each frequency;
a time-series data acquisition unit configured to acquire time-series data of transmission characteristics acquired from the control system by applying the sinusoidal signal to the table driving device to move the table in the x-axis direction and the y-axis direction with the x-axis driving mechanism and the y-axis driving mechanism; and
a spectrum analyzing unit configured to perform spectral analysis of the time-series data acquired from the control system;
wherein the cycle number or the applying duration in the frequency region in which at least one of the cycle number and the applying duration of the sinusoidal signal to be applied to the control system is different at each frequency, is determined based on an indicator of a measurement error.

12. The positioning control device according to claim 11, wherein the indicator of a measurement error is acquired from discretization noise in frequency response characteristics of the sinusoidal signal.

13. A frequency-characteristics measurement method comprising:
applying a sinusoidal signal to a table driving device in a control system, including an x-axis driving mechanism and a y-axis driving mechanism, that moves a table in an x-axis direction and a y-axis direction, the sinusoidal signal being frequency-swept so as to have a frequency region in which at least one of a cycle number and applying duration is different at each frequency;
acquiring time-series data of transmission characteristics acquired from the control system by applying the sinusoidal signal to the table driving device to move the table in the x-axis direction and the y-axis direction with the x-axis driving mechanism and the y-axis driving mechanism; and
performing spectral analysis of the time-series data acquired from the control system;
wherein the frequency-sweep is performed so as to have at least one frequency region in which the cycle number of the sinusoidal signal is constant and at least one frequency region in which the cycle number of the sinusoidal signal is different at each frequency.

14. The frequency-characteristics measurement method of claim 13,
wherein the cycle number in the frequency region in which the cycle number of the sinusoidal signal is constant, is determined based on time of the frequency-sweep that has previously determined.

15. A frequency-characteristics measurement method comprising:
applying a sinusoidal signal to a table driving device in a control system, including an x-axis driving mechanism and a y-axis driving mechanism, that moves a table in an x-axis direction and a y-axis direction, the sinusoidal signal being frequency-swept so as to have a frequency region in which at least one of a cycle number and applying duration is different at each frequency;
acquiring time-series data of transmission characteristics acquired from the control system by applying the sinusoidal signal to the table driving device to move the table in the x-axis direction and the y-axis direction with the x-axis driving mechanism and the y-axis driving mechanism; and
performing spectral analysis of the time-series data acquired from the control system;
wherein the frequency-sweep is performed so as to have at least one frequency region in which the applying duration of the sinusoidal signal is constant and at least one frequency region in which the applying duration of the sinusoidal signal is different at each frequency.

16. The positioning control device of claim 15,
wherein the applying duration in the frequency region in which the applying duration of the sinusoidal signal is constant, is determined based on time of the frequency-sweep that has been previously determined.

17. A frequency-characteristics measurement method comprising:

applying a sinusoidal signal to a table driving device in a control system, including an x-axis driving mechanism and a y-axis driving mechanism, that moves a table in an x-axis direction and a y-axis direction, the sinusoidal signal being frequency-swept so as to have a frequency region in which at least one of a cycle number and applying duration is different at each frequency;

acquiring time-series data of transmission characteristics acquired from the control system by applying the sinusoidal signal to the table driving device to move the table in the x-axis direction and the y-axis direction with the x-axis driving mechanism and the y-axis driving mechanism; and performing spectral analysis of the time-series data acquired from the control system;

wherein the cycle number or the applying duration in the frequency region in which at least one of the cycle number and the applying duration of the sinusoidal signal to be applied to the control system is different at each frequency, is determined based on an indicator of a measurement error.

18. The frequency-characteristics measurement method of claim 17, wherein the indicator of a measurement error is acquired from discretization noise in frequency response characteristics of the sinusoidal signal.

\* \* \* \* \*